United States Patent
Shin et al.

(10) Patent No.: US 10,403,356 B2
(45) Date of Patent: Sep. 3, 2019

(54) NON-VOLATILE MEMORY APPARATUS INCLUDING VOLTAGE CLAMPING CIRCUIT

(71) Applicant: SK hynix Inc., Icheon-si Gyeonggi-do (KR)

(72) Inventors: Min Chul Shin, Seoul (KR); Ho Seok Em, Hwaseong-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/814,625

(22) Filed: Nov. 16, 2017

(65) Prior Publication Data

US 2018/0158524 A1 Jun. 7, 2018

(30) Foreign Application Priority Data

Dec. 2, 2016 (KR) ................. 10-2016-0163803

(51) Int. Cl.
| | | |
|---|---|---|
| *G11C 11/00* | (2006.01) | |
| *G11C 13/00* | (2006.01) | |
| *G11C 7/12* | (2006.01) | |

(52) U.S. Cl.
CPC ...... *G11C 13/0038* (2013.01); *G11C 13/0026* (2013.01); *G11C 13/0033* (2013.01); *G11C 13/0069* (2013.01); *G11C 7/12* (2013.01); *G11C 13/0004* (2013.01); *G11C 2013/0078* (2013.01); *G11C 2213/72* (2013.01); *G11C 2213/76* (2013.01)

(58) Field of Classification Search
CPC ............ G11C 13/0038; G11C 13/0004; G11C 13/0069; G11C 2013/0078
USPC .............................. 365/189.06, 148
See application file for complete search history.

(56) References Cited

U.S. PATENT DOCUMENTS

| | | | |
|---|---|---|---|
| 7,251,163 B2 | 7/2007 | O | |
| 8,143,653 B2* | 3/2012 | Cho | ......... H01L 45/148 257/260 |
| 8,467,245 B2 | 6/2013 | Fang et al. | |
| 8,861,264 B2* | 10/2014 | Song | ......... G11C 7/12 365/163 |
| 2008/0266942 A1 | 10/2008 | Jeong et al. | |
| 2010/0118593 A1* | 5/2010 | Cho | ......... G11C 11/56 365/148 |
| 2012/0033489 A1* | 2/2012 | Song | ......... G11C 7/12 365/163 |
| 2012/0075913 A1* | 3/2012 | Kunitake | ......... G11C 13/0004 365/148 |

FOREIGN PATENT DOCUMENTS

KR    1020140090879 A    7/2014

\* cited by examiner

*Primary Examiner* — Harry W Byrne
(74) *Attorney, Agent, or Firm* — William Park & Associates Ltd.

(57) ABSTRACT

A memory apparatus may be provided. The memory apparatus may include a global bit line configured to receive a drift current. A voltage clamping circuit configured to limit a voltage level of the global bit line.

3 Claims, 10 Drawing Sheets

US 10,403,356 B2

NON-VOLATILE MEMORY APPARATUS INCLUDING VOLTAGE CLAMPING CIRCUIT

CROSS-REFERENCES TO RELATED APPLICATION

The present application claims priority under 35 U.S.C. § 119(a) to Korean application number 10-2016-0163803, filed on Dec. 2, 2016 in the Korean Intellectual Property Office, which is incorporated herein by reference in its entirety.

BACKGROUND

1. Technical Field

Various embodiments relate to a semiconductor technology, and more particularly, to a voltage clamping circuit and non-volatile memory apparatus.

2. Related Art

An electronic device includes a lot of electronic elements, and a computer system includes lots of electronic elements comprising semiconductor apparatuses. The computer system may include a memory apparatus. A dynamic random access memory (DRAM) is widely used as a general memory apparatus since the DRAM has advantages of fast data input/output speed and random access. However, the DRAM includes a memory cell comprising a capacitor and thus is volatile since the DRAM loses stored data when a power supply is cut off. A flash memory apparatus has been proposed in order to overcome the disadvantage of the DRAM. The flash memory apparatus includes a memory cell comprising a floating gate and thus is non-volatile since the flash memory apparatus maintains stored data even when a power supply is cut off. However, the flash memory apparatus has a relatively slower data input/output speed than the DRAM and can hardly support the random access.

Recently, the next-generation memory apparatuses of fast operation speed and non-volatility are being researched and developed. Examples of the next-generation memory apparatuses include a Phase-Change Random Access Memory (PCRAM), a Resistive Random Access Memory (RRAM), a Magnetic Random Access Memory (MRAM), and a Ferro-electric Random Access Memory (FRAM). The next-generation memory apparatuses have advantages of fast operation speed and non-volatility. Particularly, the PRAM includes a memory cell comprising chalcogenides and stores data by changing a resistance value of the memory cell.

SUMMARY

In an embodiment, a non-volatile memory apparatus may be provided. The non-volatile memory apparatus may include a memory cell coupled to a global bit line. The non-volatile memory apparatus may include a write driver configured to provide a drift current to the global bit line. The non-volatile memory apparatus may include a voltage clamping circuit configured to limit a voltage level of the global bit line to a clamp voltage.

In an embodiment, a non-volatile memory apparatus may be provided. The non-volatile memory apparatus may include a plurality of memory cells configured to store set data or reset data. The non-volatile memory apparatus may include a write driver configured to provide a drift current to the plurality of memory cells. The non-volatile memory apparatus may include a voltage clamping circuit configured to limit voltage levels of the plurality of memory cells so that a memory cell storing the set data is turned on and a memory cell storing the reset data is not turned on among the plurality of memory cells.

In an embodiment, a non-volatile memory apparatus may be provided. The non-volatile memory apparatus may include a memory cell coupled to a global bit line. The non-volatile memory apparatus may include a write driver configured to provide one of a drift current and a program current to the global bit line according to an operation mode. The non-volatile memory apparatus may include a voltage clamping circuit configured to limit a voltage level of the global bit line to one of a first clamp voltage and a second clamp voltage according to the operation mode.

DETAILED DESCRIPTION

Hereinafter, semiconductor apparatuses will be described below through various embodiments with reference to the accompanying drawings.

Figure 1:
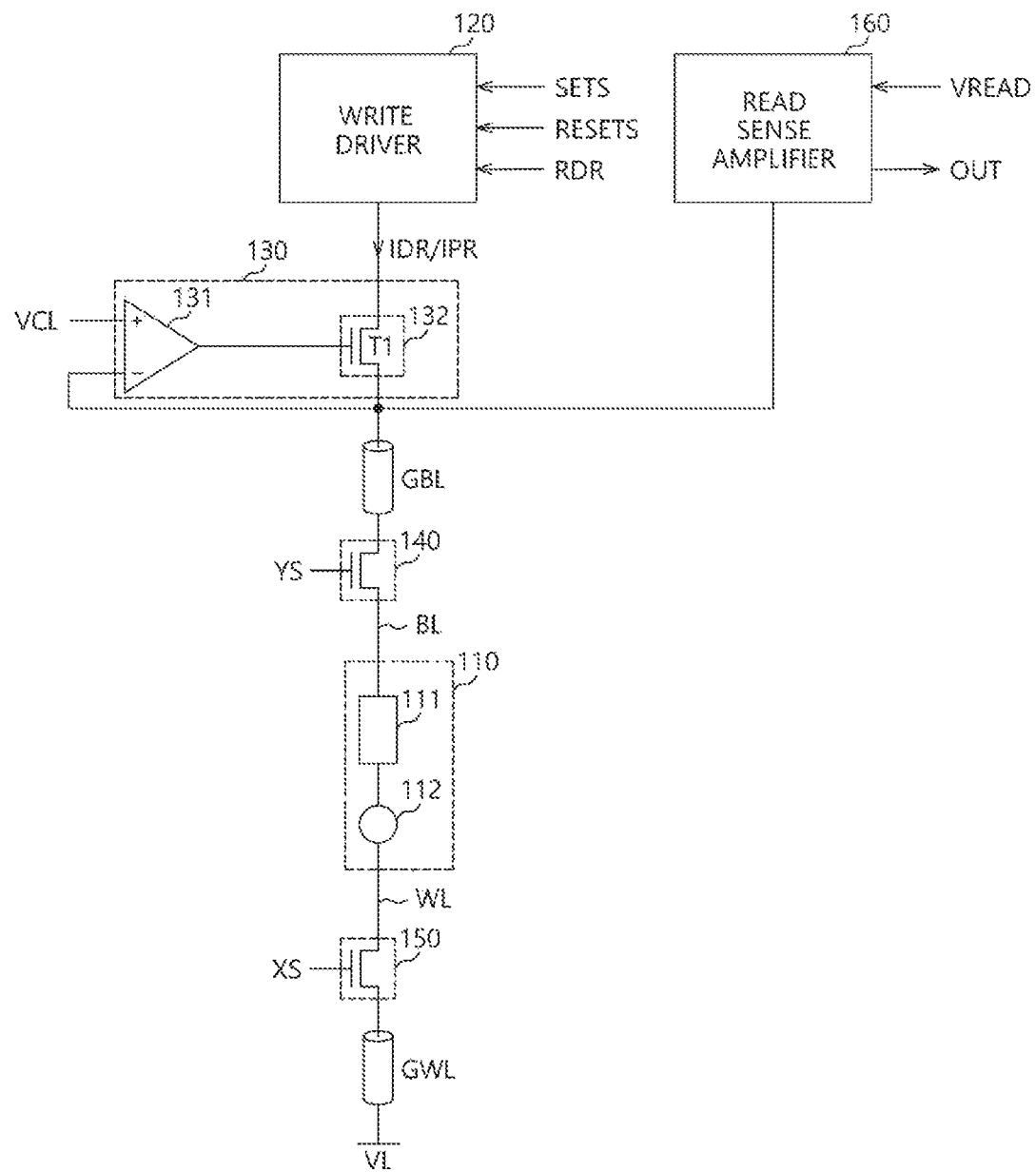
FIG. 1 is a diagram illustrating a representation of an example of a non-volatile memory apparatus in accordance with an embodiment of the present disclosure.

FIG. 1 is a diagram illustrating a representation of an example of a non-volatile memory apparatus 1 in accordance with an embodiment of the present disclosure. Referring to FIG. 1, the non-volatile memory apparatus 1 may include a memory cell 110 capable of storing data. The memory cell 110 may include a variable resistive element 111 and a switching element 112. The variable resistive element 111 may be composed of a variable resistive material and may store data. For example, the variable resistive element 111 may be programmed and/or written to a high resistance status or a low resistance status for storing data. The variable resistive element 111 having the high resistance status may represent to store a reset data, and the variable resistive element 111 having the low resistance status may represent to store a set data. The switching element 112 may allow a current to flow toward a predetermined direction such as a diode. The switching element 112 may be the Ovonic Threshold Switch (OTS). The Ovonic Threshold Switch may allow a great amount of current to flow through the Ovonic Threshold Switch when a current flowing through the Ovonic Threshold Switch is greater than a threshold current or a voltage difference between both ends of the Ovonic Threshold Switch is greater than a threshold voltage.

Figure 2:
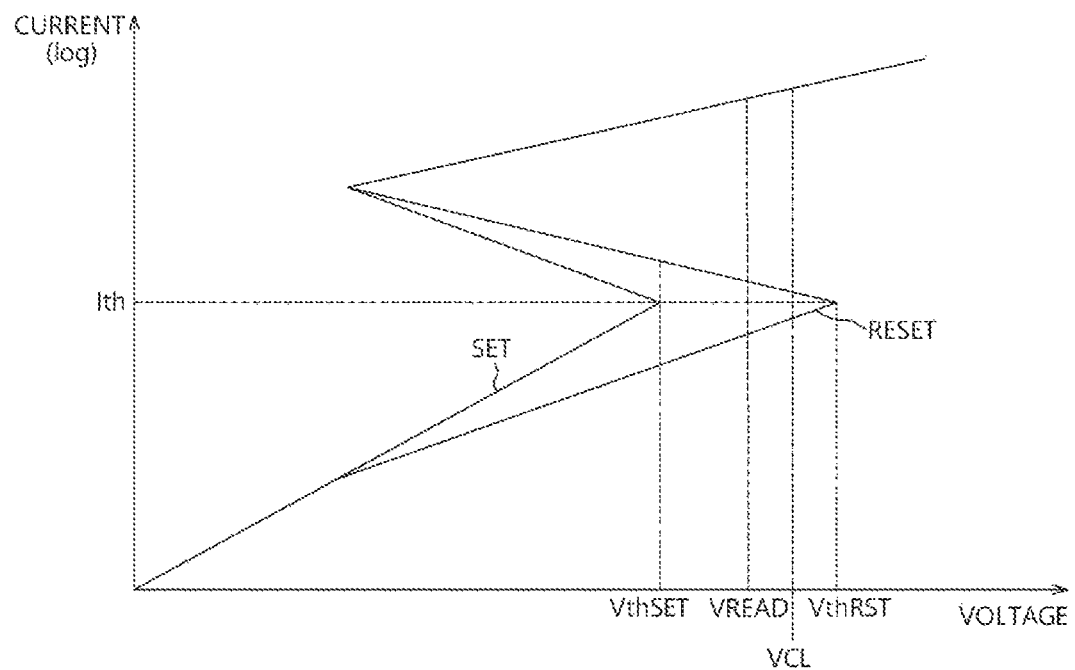
FIG. 2 is a current-voltage graph illustrating a representation of an example of a characteristic of a switching element illustrated in FIG. 1.

FIG. 2 is a current-voltage graph illustrating a representation of an example of a characteristic of the switching element 112 illustrated in FIG. 1. Referring to FIG. 2, the horizontal axis of the graph may represent a voltage difference between the both ends of the switching element 112, and the vertical axis of the graph may represent a log-scaled amount of a current flowing through the switching element 112. The switching element 112 may stay turned off while a current flowing through the switching element 112 is smaller than a threshold current value Ith or a voltage difference between both ends of the switching element 112 is smaller than a set threshold voltage VthSET. An amount of current flowing through the memory cell 110 may be very small when the switching element 112 stays turned off. When the current flowing through the switching element 112 becomes greater than the threshold current value Ith or a voltage difference between both ends of the switching element 112 becomes greater than the set threshold voltage VthSET as the current flowing through the switching element 112 increases, the switching element 112 may be turned on. When the switching element 112 is turned on, an unlimited amount of current may flow through the memory cell 110. A threshold voltage of the switching element 112 may correspond to the set threshold voltage VthSET when the memory cell 110 has the low resistance status or stores a set data SET, and may correspond to the reset threshold voltage VthRST when the memory cell 110 has the high resistance status or stores a reset data RESET. As described later, a read reference voltage VREAD for reading data stored in the memory cell 110 may have a level between levels of the set threshold voltage VthSET and the reset threshold voltage VthRST.

Referring to FIG. 1, the memory cell 110 may be coupled to a global bit line GBL. The non-volatile memory apparatus 1 may include a write driver 120 and a voltage clamping circuit 130. The write driver 120 may provide a drift current IDR to the global bit line GBL. The write driver 120 may provide the drift current IDR to the memory cell 110 through the global bit line GBL. The write driver 120 may provide the drift current IDR during a drift recovery operation. The write driver 120 may provide the drift current IDR based on an operation mode signal RDR related to the drift recovery operation. The write driver 120 may provide a program current IPR to the global bit line GBL and the memory cell 110 during a write operation. The program current IPR may be one for setting the memory cell 110 to have the high resistance status or the low resistance status, and one for storing the set data or reset data into the memory cell 110. The write driver 120 may generate the program current IPR for storing a set data and may provide the program current IPR to the global bit line GBL based on the set signal SETS during a write operation. The write driver 120 may generate the program current IPR for storing a reset data and may provide the program current IPR to the global bit line GBL based on the reset signal RESETS during a write operation.

The voltage clamping circuit 130 may limit a voltage level of the global bit line GBL. The voltage clamping circuit 130 may limit a voltage level of the memory cell 110 by limiting the voltage level of the global bit line GBL. The voltage clamping circuit 130 may limit a voltage level of the global bit line GBL to a level of a clamp voltage VCL. The level of the clamp voltage VCL may be higher than the read reference voltage VREAD and may be lower than the reset threshold voltage VthRST.

The voltage clamping circuit 130 may turn on a memory cell having the low resistance status or a memory cell storing a set data, and may not turn on a memory cell having the high resistance status or a memory cell storing a reset data, by limiting the voltage level of the global bit line GBL to the level of the clamp voltage VCL. Accordingly, when the write driver 120 provides the drift current IDR to the global bit line GBL, the drift recovery operation may not be performed to the memory cell having the high resistance status or the memory cell storing a reset data. In other words, the drift recovery operation may be performed only to the memory cell having the low resistance status or the memory cell storing a set data.

The non-volatile memory apparatus 1 may further include a column switch 140, a row switch 150, and a read sense amplifier 160. The non-volatile memory apparatus 1 may have hierarchical bit line structure and hierarchical word line structure. The memory cell 110 may be coupled to a bit line BL at one end thereof. The column switch 140 may be coupled between the global bit line GBL and the bit line BL, and may couple the global bit line GBL to the bit line BL based on a column selection signal YS. The global bit line GBL may be coupled to a plurality of bit lines through a plurality of column switches, and may be coupled to a particular bit line and a memory cell coupled to the particular bit line when a particular column switch is turned on. The memory cell 110 may be coupled to a word line WL at the other end thereof. The row switch 150 may be coupled between the word line WL and a global word line GWL, and may couple the global word line GWL to the word line WL based on a row selection signal XS. The global word line GWL may be coupled to a plurality of word lines through a plurality of row switches, and may be coupled to a particular word line and a memory cell coupled to the particular word line when a particular row switch is turned on. The global word line GWL may be coupled to a node of a low voltage VL. The low voltage VL may be a ground voltage or a negative voltage lower than the ground voltage. For example, the negative voltage may be a bulk bias voltage or a back bias voltage. For example, the ground voltage may be provided as the low voltage VL during a standby mode of the non-volatile memory apparatus 1, and the negative voltage may be provided as the low voltage VL during an active mode of the non-volatile memory apparatus 1.

The read sense amplifier 160 may read data stored in the memory cell 110 during a read operation. The read sense amplifier 160 may be coupled to the global bit line GBL, and may be coupled to the memory cell 110 through the global bit line GBL. The read sense amplifier 160 may provide the read reference voltage VREAD to the global bit line GBL during a read operation. When the read reference voltage VREAD is provided to the memory cell 110, the read sense amplifier 160 may generate an output signal OUT by sensing a value of a voltage of the memory cell 110 or a value of a current flowing through the memory cell 110.

Referring to FIG. 1, the voltage clamping circuit 130 may include a comparator 131 and a driver 132. The comparator 131 may receive the clamp voltage VCL, and may compare a voltage level of the global bit line GBL with the clamp voltage VCL. The driver 132 may change a voltage level of the global bit line GBL based on an output of the comparator 131. The driver 132 may include a transistor T1. The transistor T1 may be coupled to an output node of the comparator 131 at its gate, coupled to the write driver 120 at its drain, and coupled to the global bit line GBL at its source. The driver 132 may maintain the global bit line GBL to have a substantially same voltage level as the clamp voltage VCL.

Figure 3:
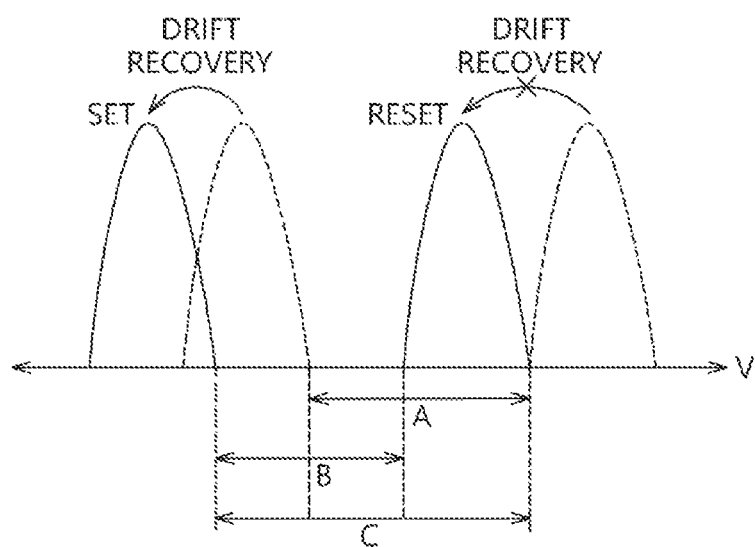
FIG. 3 is a resistance distribution graph illustrating a representation of an example of a memory cell, a resistance change due to a drift phenomenon, and a resistance change due to a drift recovery operation.

FIG. 3 is a resistance distribution graph illustrating a representation of an example of a memory cell, a resistance change due to a drift phenomenon, and a resistance change due to a drift recovery operation. Referring to FIGS. 1 and 3, the memory cell 110 may have 2 resistance distributions as illustrated with solid lines in the figure when writing set data and reset data into the memory cell 110 through the write driver 120. The left solid line may represent the set data SET or a low resistance distribution and the right solid line may represent the reset data RESET or a high resistance distribution. After that, data stored in the memory cell 110, that is, a resistance status of the memory cell 110 may change due to a drift phenomenon as time goes by. In general, the drift phenomenon may occur such that a resistance value increases. As illustrated with dotted lines in the figure, the set data SET or the low resistance distribution and the reset data RESET or the high resistance distribution may move to right side of the solid lines due to the drift phenomenon. Without a drift recovery operation, a sensing margin for discriminating between the set data SET and the reset data RESET may be "A" as illustrated in the figure. The resistance distributions, which have moved to right side of the solid lines due to the drift phenomenon, may be recovered to move left side by performing the drift recovery operation to the memory cells storing the set data SET and the reset data RESET. The recovered resistance distributions may become the resistance distributions, which are right after the write operation, as illustrated with the solid lines in the figure. At this time, a sensing margin for discriminating between the set data SET and the reset data RESET may be "B" as illustrated in the figure. Since the sensing margin "B" is similar to the sensing margin "A", there may not be an effect of expanding the sensing margin even through the drift recovery operation. In accordance with an embodiment of the present disclosure, the non-volatile memory apparatus 1 may selectively perform the drift recovery operation only to a memory cell storing the set data SET. In other words, by limiting the voltage level of the global bit line GBL to the clamp voltage VCL, the non-volatile memory apparatus 1 may turn on only a memory cell storing the set data SET and may selectively perform the drift recovery operation only to the turned-on memory cell. Therefore, the resistance distribution of the set data SET may move to the left side while the resistance distribution of the reset data RESET may stay as it is as illustrated with the dotted line. At this time, a sensing margin for discriminating between the set data SET and the reset data RESET may be "C" as illustrated in the figure. The sensing margin "C" may be much greater than the sensing margins "A" and "B", and thus the sensing margin for discriminating between the set data SET and the reset data RESET may be greatly expanded.

Figure 4:
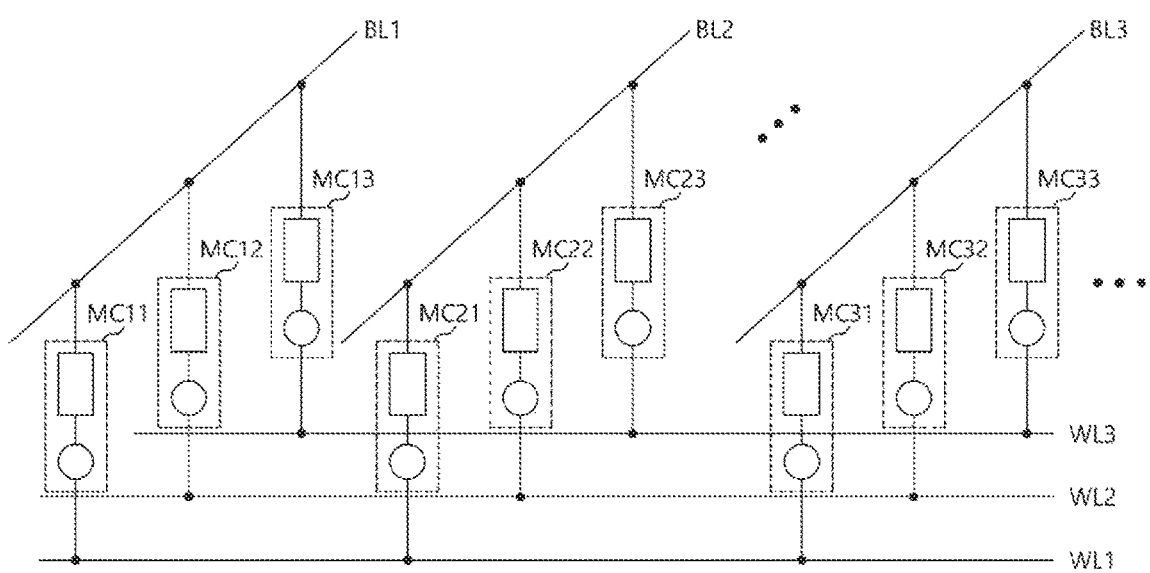
FIG. 4 is a diagram illustrating a representation of an example of a memory cell array of a non-volatile memory apparatus in accordance with an embodiment of the present disclosure.

FIG. 4 is a diagram illustrating a representation of an example of a memory cell array 400 of a non-volatile memory apparatus in accordance with an embodiment of the present disclosure. Although FIG. 4 illustrates the memory cell array 400 including 9 memory cells at intersections of 3 bit lines and 3 word lines, the memory cell array 400 may include more bit lines, word lines, and memory cells. A first memory cell MC11 may be coupled to a first bit line BL1 at one end, and coupled to a first word line WL1 at the other end. A second memory cell MC12 may be coupled to the first bit line BL1 at one end, and coupled to a second word line WL2 at the other end. A third memory cell MC13 may be coupled to the first bit line BL1 at one end, and coupled to a third word line WL3 at the other end. A fourth memory cell MC21 may be coupled to a second bit line BL2 at one end, and coupled to the first word line WL1 at the other end. A fifth memory cell MC22 may be coupled to the second bit line BL2 at one end, and coupled to the second word line WL2 at the other end. A sixth memory cell MC23 may be coupled to the second bit line BL2 at one end, and coupled to the third word line WL3 at the other end. A seventh memory cell MC31 may be coupled to the third bit line BL3 at one end, and coupled to the first word line WL1 at the other end. An eighth memory cell MC32 may be coupled to the third bit line BL3 at one end, and coupled to the second word line WL2 at the other end. A ninth memory cell MC33 may be coupled to a third bit line BL3 at one end, and coupled to the third word line WL3 at the other end. Although not illustrated, each of the first to third bit lines BL1 to BL3 may be coupled to the global bit line GBL through the column switch 140 and each of the first to third word lines WL1 to WL3 may be coupled to the global bit line GBL through the row switch 150. It is assumed that the first memory cell MC11 has a low resistance status and stores a set data SET, and each of the second and third memory cells MC12 and MC13 has a high resistance status and stores a reset data RESET. During a drift recovery operation, for example, the first bit line BL1 may be coupled to the global bit line GBL through the column switch 140 and each of the first to third word lines WL1 to WL3 may be coupled to the global bit line GBL through the row switch 150. For the drift recovery operation, the write driver 120 may provide the drift current IDR to the global bit line GBL. At this time, when the drift current IDR becomes greater than a reset threshold current, all of the first to third memory cells MC11, MC12 and MC13 may be turned on and thus the generated drift phenomenon may be compensated. At this time, in accordance with an embodiment of the present disclosure, the voltage clamping circuit 130 may limit a voltage level of the global bit line GBL to the clamp voltage VCL. Therefore, the first memory cell MC11 may be turned on while the second and third memory cells MC12 and MC13 may be turned off, and thus the drift recovery operation may be performed only to the first memory cell MC11.

Figure 5:
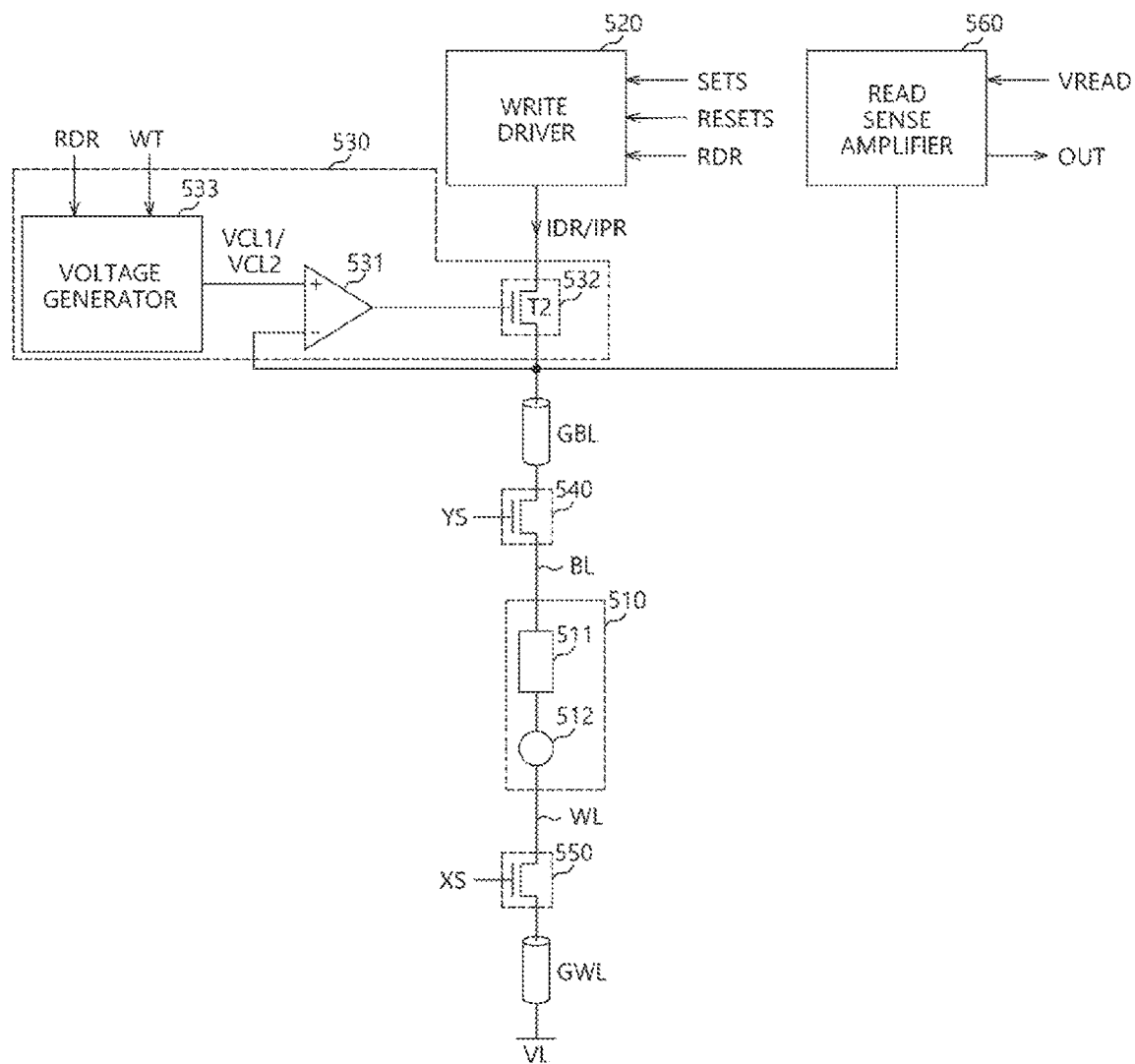
FIG. 5 is a diagram illustrating a representation of an example of a non-volatile memory apparatus in accordance with an embodiment of the present disclosure.

FIG. 5 is a diagram illustrating a representation of an example of a non-volatile memory apparatus 5 in accordance with an embodiment of the present disclosure. Referring to FIG. 5, the non-volatile memory apparatus 5 may include a memory cell 510, a write driver 520, and a voltage clamping circuit 530. The memory cell 510 may include a variable resistive element 511 and a switching element 512. The memory cell 510 may be coupled to a bit line BL at one end thereof, and the column switch 540 may couple a global bit line GBL to the bit line BL based on a column selection signal YS. The memory cell 510 may be coupled to a word line WL at the other end thereof. The row switch 550 may couple a global word line GWL to the word line WL based on a row selection signal XS. The global word line GWL may be coupled to a node of a low voltage VL.

The write driver 520 may provide one of a drift current IDR and a program current IPR to the global bit line GBL according to an operation mode of the non-volatile memory apparatus 5. The write driver 520 may provide the drift current IDR to the global bit line GBL during a drift recovery operation. The write driver 520 may provide the drift current IDR based on a drift recovery signal RDR. The write driver 520 may provide a program current IPR to the global bit line GBL during a write operation. The write driver 520 may provide a program current IPR for writing a set data into the memory cell 510 based on a set signal SETS. The write driver 520 may provide a program current IPR for writing a reset data into the memory cell 510 based on a reset signal RESETS.

The voltage clamping circuit 530 may limit a voltage level of the global bit line GBL to one of a first clamp voltage VCL1 and a second clamp voltage VCL2 according to an operation mode of the non-volatile memory apparatus 5. The voltage clamping circuit 530 may limit a voltage level of the global bit line GBL to the first clamp voltage VCL1 during a drift recovery operation. The voltage clamping circuit 530 may limit a voltage level of the global bit line GBL to the second clamp voltage VCL2 during a write operation.

Figure 6:
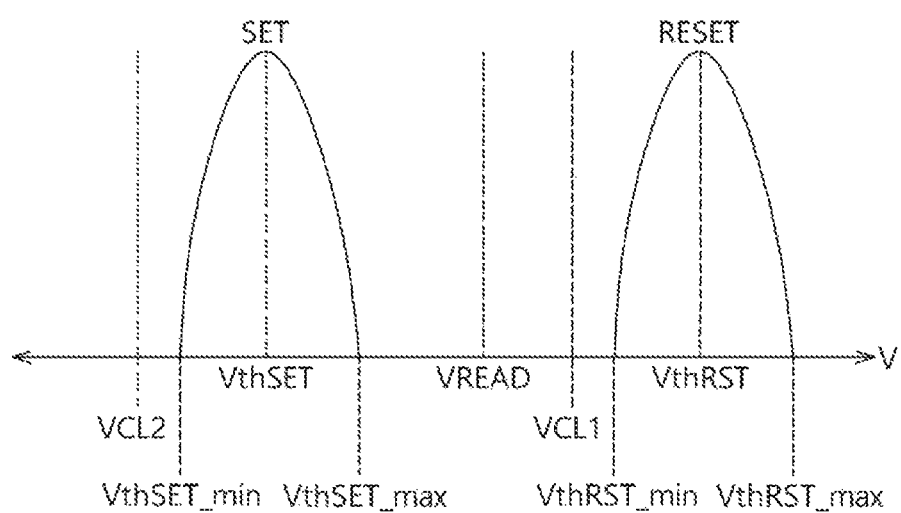
FIG. 6 is a graph illustrating levels of first and second clamp voltages in accordance with an embodiment of the present disclosure.

FIG. 6 is a graph illustrating levels of the first and second clamp voltages VCL1 and VCL2 in accordance with an embodiment of the present disclosure. FIG. 6 illustrates a resistance distribution of a memory cell storing a set data SET and a resistance distribution of a memory cell storing a reset data RESET. In the resistance distribution of a memory cell storing the set data SET, the minimum threshold voltage may be the minimum set threshold voltage VthSET_min and the maximum threshold voltage may be the maximum set threshold voltage VthSET_max. The set threshold voltage VthSET may have a median value between the minimum set threshold voltage VthSET_min and the maximum set threshold voltage VthSET_max. In the resistance distribution of a memory cell storing the reset data RESET, the minimum threshold voltage may be the minimum reset threshold voltage VthRST_min and the maximum threshold voltage may be the maximum reset threshold voltage VthRST_max. The reset threshold voltage VthRST may have a median value between the minimum reset threshold voltage VthRST_min and the maximum reset threshold voltage VthRST_max. A read reference voltage VREAD may have a value between the maximum set threshold voltage VthSET_max and the minimum reset threshold voltage VthRST_min. For example, the read reference voltage VREAD may have an average value of the set threshold voltage VthSET and the reset threshold voltage VthRST. The first clamp voltage VCL1 may have the same level as the clamp voltage VCL described with reference to FIGS. 1 and 2. The first clamp voltage VCL1 may have a higher level than the read reference voltage VREAD and may have a lower level than the minimum reset threshold voltage VthRST_min. In other words, the first clamp voltage VCL1 may have a value between the read reference voltage VREAD and the minimum reset threshold voltage VthRST_min. The second clamp voltage VCL2 may have a lower level than the first clamp voltage VCL1. For example, the second clamp voltage VCL2 may have a lower level than the minimum set threshold voltage VthSET_min.

Referring to FIG. 5, the voltage clamping circuit 530 may include a voltage generator 533, a comparator 531, and a driver 532. The voltage generator 533 may output one of the first clamp voltage VCL1 and the second clamp voltage VCL2 to the comparator 531 based on an operation mode signal. The operation mode signal may include a drift recovery signal RDR and a write signal WT. The drift recovery signal RDR may be generated when a drift recovery operation is performed to the non-volatile memory apparatus 5, and the write signal WT may be generated when a write operation is performed to the non-volatile memory apparatus 5. The voltage generator 533 may output the first clamp voltage VCL1 to the comparator 531 based on the drift recovery signal RDR, and output the second clamp voltage VCL2 to the comparator 531 based on the write signal WT.

The comparator 531 may receive the first clamp voltage VCL1 and the second clamp voltage VCL2 from the voltage generator 533. The comparator 531 may compare a voltage level of the global bit line GBL with the output of the voltage generator 533. The driver 532 may change a voltage level of the global bit line GBL based on the output of the comparator 531. The driver 532 may maintain the global bit line GBL to have a substantially same voltage level as one of the first clamp voltage VCL1 and the second clamp voltage VCL2. The driver 532 may include a transistor T2. The transistor T2 may be coupled to an output node of the comparator 531 at its gate, coupled to the write driver 520 at its drain, and coupled to the global bit line GBL at its source.

The non-volatile memory apparatus 5 may further include a read sense amplifier 560. The read sense amplifier 560 may read data stored in the memory cell 510 during a read operation. The read sense amplifier 560 may be coupled to the global bit line GBL, and may be coupled to the memory cell 510 through the global bit line GBL. The read sense amplifier 560 may provide the read reference voltage VREAD to the global bit line GBL during a read operation. When the read reference voltage VREAD is provided to the memory cell 510, the read sense amplifier 560 may generate an output signal OUT by sensing a value of a voltage of the memory cell 510 or a value of a current flowing through the memory cell 510.

The voltage clamping circuit 530 may limit a voltage level of the global bit line GBL to the first clamp voltage VCL1 during a drift recovery operation so that the drift recovery operation may be performed only to the memory cell 510 storing the set data SET. Therefore, the non-volatile memory apparatus 5 may have the same effect as the non-volatile memory apparatus 1 described with reference to FIG. 1. The voltage clamping circuit 530 may limit a voltage level of the global bit line GBL to the second clamp voltage VCL2 during a write operation. Referring to FIG. 4, when a write operation is performed to the first memory cell MC11 due to selection of the first bit line BL1 and the first word line WL1, voltage levels of the second and third memory cells MC12 and MC13, which are half-selected since the second and third word lines WL2 and WL3 are not selected, may rise due to off leakage by the disturb phenomenon. When at least one of the second and third memory cells MC12 and MC13 has a low threshold voltage, especially the set threshold voltage VthSET, the memory cell of the low threshold voltage may be turned on first and thus the write operation to the first memory cell MC11 may fail. Furthermore, data stored in the memory cell of the low threshold voltage may be lost. In order to prevent an excessive rise of the voltage level of the global bit line GBL, the voltage clamping circuit 530 may limit the voltage level of the global bit line GBL to the second clamp voltage VCL2 thereby improving a possible disturb phenomenon. Although the voltage clamping circuit 530 may limit the voltage level of the global bit line GBL during whole time of the write operation, in an embodiment, the voltage clamping circuit 530 may limit the voltage level of the global bit line GBL for a predetermined time after the write operation starts. For example, the predetermined time may be a time segment from when a write operation starts to when the memory cell 510 is turned on by the program current IPR. When the memory cell 510 is turned on, the voltage clamping circuit 530 may not limit the voltage level of the global bit line GBL thereby improving a current drivability for providing the program current IPR to a memory cell disposed relatively far from the write driver 520.

Figure 7:
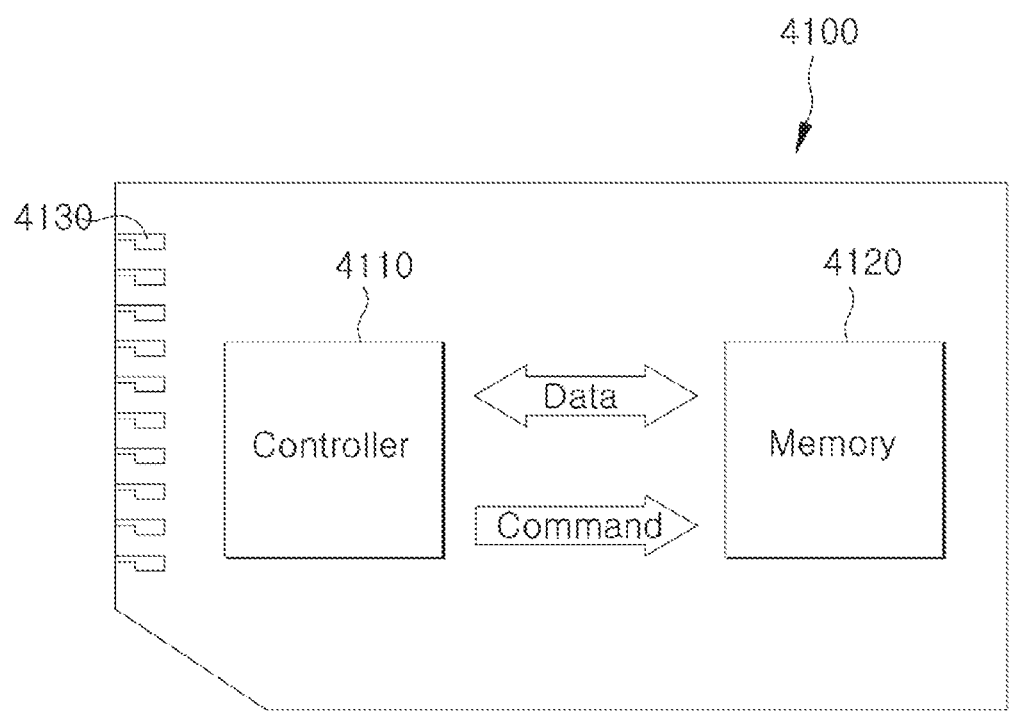
FIG. 7 is a diagram illustrating a representation of an example of a memory card system including a non-volatile memory apparatus in accordance with an embodiment of the present disclosure.

FIG. 7 is a schematic diagram illustrating a representation of an example of a memory card system 4100 including the non-volatile memory apparatuses 1 and/or 5 in accordance with various embodiments of the present disclosure. Referring to FIG. 7, the memory card system 4100 may include a controller 4110, a memory 4120, and an interface member 4130. The controller 4110 and the memory 4120 may be configured to exchange a command and/or data. For example, the memory 4120 may be used to store a command, which is executed by the controller 4110, and/or user data.

The memory card system 4100 may store data into the memory 4120 or output data to an external from the memory 4120. The memory 4120 may include the non-volatile memory apparatuses 1 and/or 5 in accordance with various embodiments of the present disclosure.

The interface member 4130 may configured to transfer data from/to an external. The memory card system 4100 may be a multimedia card (MMC), a secure digital card (SD) or a portable data storage device.

Figure 8:
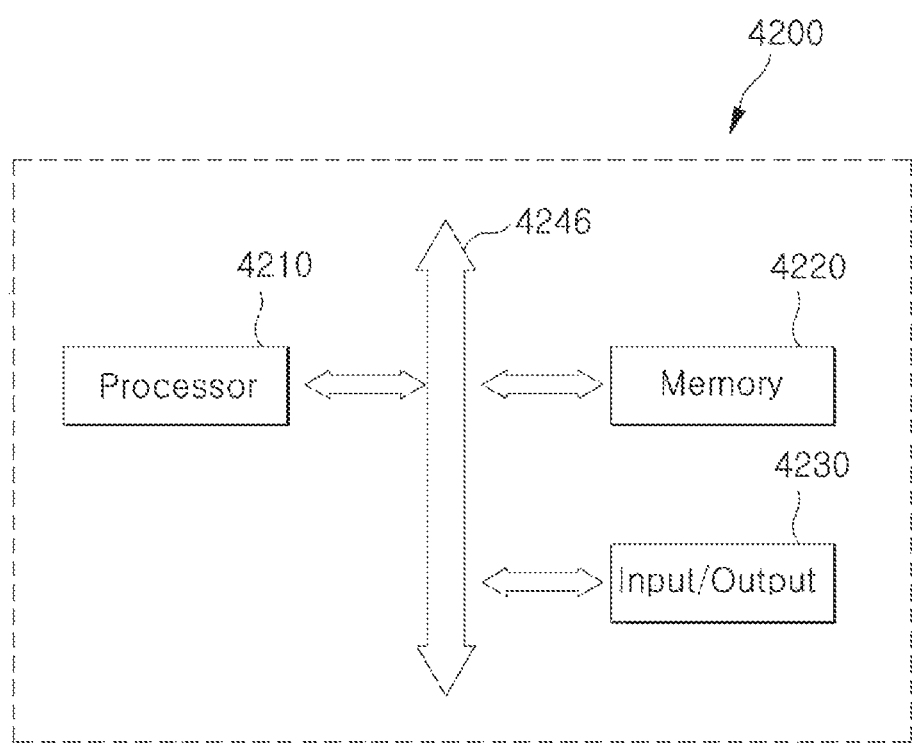
FIG. 8 is a block diagram illustrating a representation of an example of an electronic device including a non-volatile memory apparatus in accordance with various embodiments of the present disclosure.

FIG. 8 is a block diagram illustrating a representation of an example of an electronic device 4200 including the non-volatile memory apparatuses 1 and/or 5 in accordance with various embodiments of the present disclosure. Referring to FIG. 8, the electronic device 4200 may include a processor 4210, a memory 4220 and an input and output (input/output) device 4230. The processor 4210, the memory 4220, and the input/output device 4230 may be coupled to one another through a bus 4246.

The memory 4220 may receive a control signal from the processor 4210. The memory 4220 may be used to store code and data for the operation of the processor 4210. The memory 4220 may be used to store data, which is accessed through the bus 4246. The memory 4220 may include the non-volatile memory apparatuses 1 and/or 5 in accordance with various embodiments of the present disclosure. Additional circuits and control signals may be provided for implementations and modifications of the present disclosure.

The electronic device 4200 may be included in various electronic control devices requiring the memory 4220. For example, the electronic device 4200 may be used in a personal digital assistant (PDA), a laptop computer, a portable computer, a web tablet, a wireless phone, a portable phone, a digital music player, a MP3 player, a navigation, a solid state drive (SSD), a household appliance, or any device capable of wireless communication.

Figure 9:
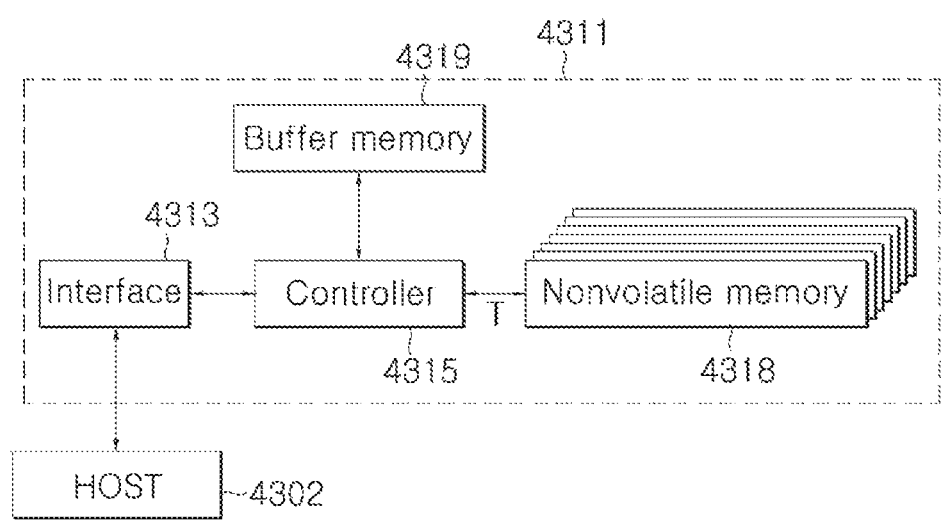
FIG. 9 is a block diagram illustrating a representation of an example of a data storage device including a non-volatile memory apparatus in accordance with various embodiments of the present disclosure.
Figure 10:
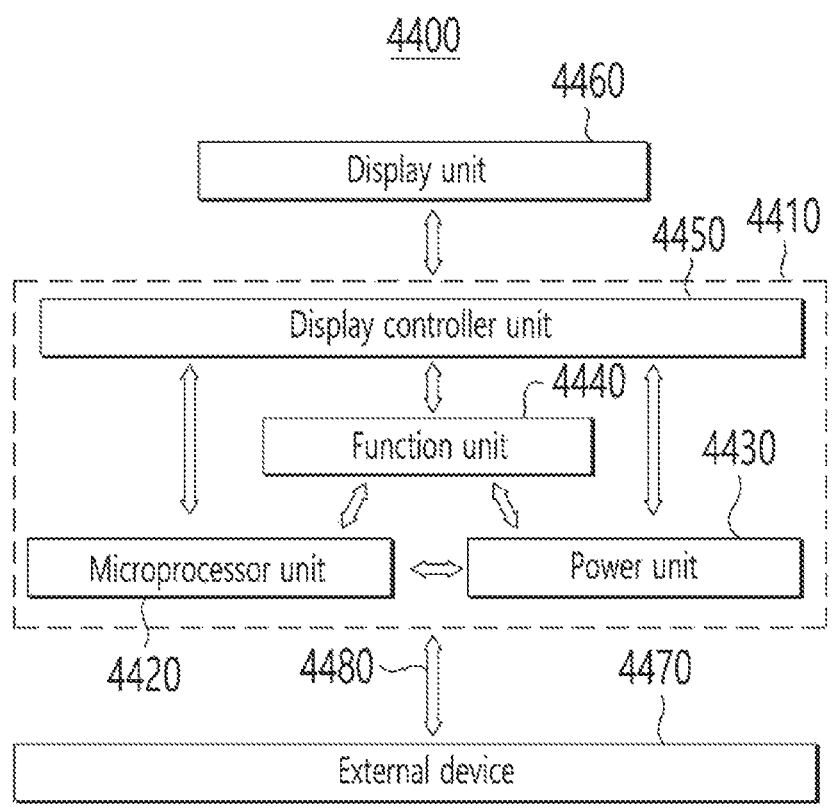
FIG. 10 is a block diagram illustrating a representation of an example of an electronic system including a non-volatile memory apparatus in accordance with various embodiments of the present disclosure.

Descriptions with reference to FIGS. 9 and 10 will be examples of the implementations and modifications of the electronic device 4200.

FIG. 9 is a block diagram illustrating a representation of an example of a data storage device including the non-volatile memory apparatuses 1 and/or 5 in accordance with various embodiments of the present disclosure. Referring to FIG. 9, a data storage device may be provided such as the solid state drive (SSD: 4311). The SSD 4311 may include an interface 4313, a controller 4315, a non-volatile memory 4318, and a buffer memory 4319.

The SSD 4311 stores data through a semiconductor device. The SSD 4311 has an advantage over the hard disk drive (HDD) since the SSD 4311 operates faster and is friendly to miniaturization and weight-lightening while having low mechanical delay or failure rate, low heating and low noise. The SSD 4311 may be widely used in a notebook PC, a netbook, a desktop PC, a MP3 player, or a portable storage device.

The controller 4315 may be disposed near to the interface 4313 and may be electrically coupled to the interface 4313. The controller 4315 may be a microprocessor including a memory controller and a buffer controller. The non-volatile memory 4318 may be disposed near the controller 4315 and may be electrically coupled to the controller 4315 through a connection terminal T. Data storage capacity of the SSD 4311 may correspond to that of the non-volatile memory 4318. The buffer memory 4319 may be disposed near the controller 4315 and may be electrically coupled to the controller 4315.

The interface 4313 may be coupled to a host 4302 and configured to transfer an electrical signal such as data. For example, the interface 4313 may conform to a protocol such as the serial advanced technology attachment (SATA), the integrated drive electronics (IDE), the small computer system interface (SCSI), and/or combination thereof. The non-volatile memory 4318 may be coupled to the interface 4313 through the controller 4315.

The non-volatile memory 4318 may store data provided through the interface 4313. The non-volatile memory 4318 may include the non-volatile memory apparatuses 1 and/or 5 in accordance with various embodiments of the present disclosure. The non-volatile memory 4318 may maintain stored data even when power supply to the SSD 4311 is cut off.

The buffer memory 4319 may include a volatile memory. The volatile memory may be the dynamic random-access memory (DRAM) and/or the static RAM (SRAM). The buffer memory 4319 may operate faster than the non-volatile memory 4318.

The interface 4313 may process data faster than the non-volatile memory 4318. The buffer memory 4319 may temporarily store data. Data provided through the interface 4313 may be temporarily stored in the buffer memory 4319 via the controller 4315, and may be stored in the non-volatile memory 4318 at the data storage speed of the non-volatile memory 4318.

Among data stored in the non-volatile memory 4318, frequently accessed data may be read in advance from the non-volatile memory 4318 and temporarily stored in the buffer memory 4319. That is, the buffer memory 4319 may serve to increase effective operation speed of the SSD 4311 and reduce error rate of the SSD 4311.

FIG. 10 is a block diagram illustrating a representation of an example of an electronic system 4400 including the non-volatile memory apparatuses 1 and/or 5 in accordance with various embodiments of the present disclosure. Referring to FIG. 10, the electronic system 4400 may include a body 4410. a microprocessor unit 4420, a power unit 4430, a function unit 4440, and a display controller unit 4450.

The body 4410 may be a motherboard formed with the printed circuit board (PCB). The microprocessor unit 4420, the power unit 4430, the function unit 4440, and the display controller unit 4450 may be mounted on the body 4410. A display unit 4460 may be disposed in or outside the body 4410. For example, the display unit 4460 may be disposed on a surface of the body 4410 and display image processed by the display controller unit 4450.

The power unit 4430 may receive a predetermined voltage from an external battery, divide the provided voltage into required voltages of various levels, and provide the divided voltages to the microprocessor unit 4420, the function unit 4440, the display controller unit 4450 and so forth. The microprocessor unit 4420 may receive the divided voltage from the power unit 4430 and may control the function unit 4440 and the display unit 4460. The function unit 4440 may perform various functions of the electronic system 4400. For example, if the electronic system 4400 is a cellular phone, the function unit 4440 may include various element capable of cellular phone functions such as dialling, image output to the display unit 4460 and voice output to a speaker through communication with an external device 4470 and so forth, and may function as a camera image processor when a camera is mounted in the electronic system 4400.

If the electronic system 4400 is coupled to a memory card for storage capacity expansion, the function unit 4440 may be a memory card controller. The function unit 4440 may exchange signals with the external device 4470 through a wired or wireless communication unit 4480. If the electronic system 4400 requires a device such as a universal serial bus (USB) storage device for function expansion, the function unit 4440 may work as an interface controller. The non-volatile memory apparatuses 1 and/or 5 in accordance with various embodiments of the present disclosure may be applied to one or more of the microprocessor unit 4420 and the function unit 4440.

While certain embodiments have been described above, it will be understood to those skilled in the art that the embodiments described are by way of example only. Accordingly, the non-volatile memory apparatus should not be limited based on the described embodiments. Rather, the non-volatile memory apparatus described herein should only be limited in light of the claims that follow when taken in conjunction with the above description and accompanying drawings.

What is claimed is:
1. A non-volatile memory apparatus comprising:
   a plurality of memory cells configured to store set data or reset data;
   a write driver configured to provide a drift current to the plurality of memory cells; and
   a voltage clamping circuit configured to limit voltage levels of the plurality of memory cells, when the write driver provides the drift current to the plurality of memory cells, so that a memory cell storing the set data is turned on and a memory cell storing the reset data is turned off among the plurality of memory cells.
2. The non-volatile memory apparatus of claim 1, wherein the plurality of memory cells are coupled to a global bit line, and the voltage clamping circuit limits a voltage level of the global bit line to a clamp voltage.
3. The non-volatile memory apparatus of claim 2, wherein the clamping voltage has a higher level than a read reference voltage and a lower level than a reset threshold voltage.

* * * * *